US 7,031,069 B2

(12) United States Patent
Gruner et al.

(10) Patent No.: US 7,031,069 B2
(45) Date of Patent: *Apr. 18, 2006

(54) MICROLITHOGRAPHIC ILLUMINATION METHOD AND A PROJECTION LENS FOR CARRYING OUT THE METHOD

(75) Inventors: Toralf Gruner, Chemnitz (DE); Manfred Maul, Aalen (DE); Rudolf Von Buenau, Jena (DE)

(73) Assignee: Carl Zeiss Smt AG, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/831,293

(22) Filed: Apr. 26, 2004

(65) Prior Publication Data
US 2005/0002111 A1 Jan. 6, 2005

Related U.S. Application Data

(63) Continuation-in-part of application No. 10/146,915, filed on May 17, 2002, now Pat. No. 6,728,043.

(30) Foreign Application Priority Data
May 19, 2001 (DE) .................. 101 24 474

(51) Int. Cl.
*G02B 27/10* (2006.01)

(52) U.S. Cl. ............... 359/639; 359/487; 359/737; 359/900

(58) Field of Classification Search .......... 359/487, 359/488, 631, 637, 639, 726, 727, 737, 900; 355/45, 66

See application file for complete search history.

(56) References Cited

U.S. PATENT DOCUMENTS

| 5,537,260 A | 7/1996 | Williamson |
| 5,715,084 A | 2/1998 | Takahashi et al. |
| 5,805,357 A | 9/1998 | Omura |

(Continued)

FOREIGN PATENT DOCUMENTS

EP      0 964 282 A2      12/1999

(Continued)

OTHER PUBLICATIONS

John Burnett et al., "Intrinsic bifringence in calcium fluoride and barium fluoride," Physical Review B, pp. 241102-1 to 241102-3, vol. 64, XP-001098828, Nov. 29, 2001.

(Continued)

*Primary Examiner*—Scott J. Sugarman
*Assistant Examiner*—Darryl J. Collins
(74) *Attorney, Agent, or Firm*—Sughrue Mion, PLLC

(57) ABSTRACT

A microlithographic illumination method for imaging a pattern arranged in an object plane of a projection lens onto an image plane of the projection lens, under which a special means for optically correcting the optical path lengths of s-polarized and p-polarized light such that light beams of both polarizations will either traverse essentially the same optical path length between the object plane and the image plane or any existing difference in their optical path lengths will be retained, largely independently of their angles of incidence on the image plane, which will allow avoiding contrast variations due to pattern orientation when imaging finely structured patterns, is disclosed. The contrast variations may be caused by uncorrected projection lenses due to their employment of materials that exhibit stress birefringence and/or coated optical components, such as deflecting mirrors, that are used at large angles of incidence.

81 Claims, 3 Drawing Sheets

U.S. PATENT DOCUMENTS

| | | |
|---|---|---|
| 6,496,306 B1 | 12/2002 | Shafer et al. |
| 6,717,722 B1 | 4/2004 | Shafer et al. |
| 6,728,043 B1 * | 4/2004 | Gruner et al. ............... 359/637 |

FOREIGN PATENT DOCUMENTS

| | | |
|---|---|---|
| EP | 0 989 434 A2 | 3/2000 |
| JP | 11054411 A | 2/1999 |

OTHER PUBLICATIONS

John H. Burnett, et al, Preliminary Determination of an Intrinsic Birefringence in $CaF_2$, National Institute of Standards and Technology, May 7, 2001, Gaithersburg, MD. (XP-002218848).

John H. Burnett, et al, Preliminary Determination of an Intrinsic Birefringence in $CaF_2$, National Institute of Standards and Technology, May 7, 2001, Gaithersburg, MD. (XP-002218847).

John H. Burnett, et al, "Intrinsic Birfringence in 157 nm Materials", National Institute of Standards and Technology, Gaithersburg, MD, (XP-002218849).

John H. Burnett, et al, "Intrinsic Birfringence in Calcium Fluoride", National Institute of Standards and Technology, Gaithersburg, MD, (XP-002232195).

* cited by examiner

MICROLITHOGRAPHIC ILLUMINATION METHOD AND A PROJECTION LENS FOR CARRYING OUT THE METHOD

This is a Continuation-In-Part Application of application Ser. No. 10/146,915, filed May 17, 2002 now U.S. Pat. No. 6,728,043, which claims benefit of German Patent Application No. 101 24 474.6, filed on May 19, 2001. The disclosure of application Ser. No. 10/146,915 is incorporated into this Continuation-In-Part Application by reference.

BACKGROUND OF THE INVENTION

1. Field of the Invention

The invention relates to a method for imaging a pattern arranged in an object plane of a projection lens onto an image plane of the projection lens, a projection lens for carrying out the method, and a method for fabricating such a projection lens.

2. Description of the Related Art

Illumination methods and projection lenses of the types are employed on projection illumination systems, such as wafer scanners or wafer steppers, that are used for fabricating semiconductor devices or other types of microelectronic devices and serve to project reduced images of patterns present on photomasks or reticles, which shall hereinafter be generically referred to as "masks" or "reticles," at ultrahigh resolution onto an object that has been coated with a layer of photosensitive material.

Improving the spatial resolutions of the projected images of masks having increasingly finer patterns will necessitate both increasing the numerical aperture (NA) of the image end of the projection lens involved and employing light having shorter wavelengths, preferably ultraviolet light having wavelengths less than about 260 nm.

There are few materials, in particular, synthetic quartz glass and crystalline fluorides, such as calcium fluoride, that are sufficiently transparent at such short wavelengths available for fabricating the optical components involved. However, the materials suffer from photoelastic effects, i.e., may affect the mutually orthogonally polarized components of the field vectors of transmitted light differently due to stress birefringence.

Since the Abbé numbers of those materials that are available all lie rather close to one another, it is difficult to configure systems consisting entirely of refractive components that have been sufficiently well-corrected for chromatic aberrations. Catadioptric systems that combine refracting and reflecting components, i.e., in particular, lenses and mirrors, are thus predominantly favored for configuring high-resolution projection lenses. Such systems frequently employ deflecting mirrors that are used at large angles of incidence and serve to deflect light traveling between the object plane and image plane of the projection lenses to one or more concave mirrors or to deflect light reflected by same back to same. In order that the mirrors will have high reflectivities, they will usually have reflective coatings, which will normally be multilayer reflective coatings. The curved surfaces, some of which may be sharply curved, of lenses will also usually be coated in order to reduce reflections, where light transiting some of same will also have large angles of incidence on same. However, employing dielectric coatings on optical components that involve large angles of incidence may affect transmitted light in various ways that will depend upon its polarization.

In the case of catadioptric systems of the aforementioned type, it has been found that the projected images of lines present on the patterns on the masks will frequently exhibit contrast variations that will depend upon the orientations of the lines. The variations in image contrast with orientation, which are also termed "horizontal-vertical variations" (H-V variations), will be reflected in discernible variations in the imaged widths of the lines on photoresists, where their imaged widths will depend upon their respective orientations.

Various means for avoiding such orientation-dependent contrast variations have been proposed. European Pat. No. EP 964 282 A2 concerns itself with the problem that catadioptric projection systems that employ deflecting mirrors introduce a preferred polarization direction for light transiting same that is attributable to their multilayer-coated deflecting mirrors having differing reflectivities for s-polarized and p-polarized light, which will cause light that is unpolarized at their reticle plane to become partially polarized when it reached their image plane, which, in turn, will cause their imaging characteristics to vary with orientation. According to the proposal presented there, this effect may be counteracted by creating a lead polarization by creating partially polarized light having a prescribed residual polarization within the illumination system involved that will then be compensated for by its projection lens such that light exiting the latter will be unpolarized.

A catadioptric projection lens having a polarization beamsplitter that is also sup-posed to minimize orientation-dependent contrast variations is known from European Pat. No. EP 0 602 923 B1, which corresponds to U.S. Pat. No. 5,715,084. The projection lens, which is used with linearly polarized light, has a means for altering the state of polarization of light transiting same that transforms incident linearly polarized light into circularly polarized light, which, in terms of the intensities of its orthogonally polarized field components, is equivalent to unpolarized light, situated between the projection lens' beamsplitter cube and its image plane, which is intended to provide that image contrast will be independent of the orientations of patterns appearing on masks. A corresponding proposal was also made under European Pat. No. EP 0 608 572, which corresponds to U.S. Pat. No. 5,537,260.

However, it has been found that contrast variations among patterns that have differing orientations on masks may still occur, particularly in the case of catadioptric projection lenses operated with large aperture and having at least one deflecting mirror, in spite of those measures to counteract same that have been described above.

OBJECTS OF THE INVENTION

One object of the invention is to provide an illumination method, particularly one that may be employed in microlithography, a projection lens that will be suitable for use in conjunction with same, and a method for fabricating the projection lens that will allow avoiding the disadvantages of the prior art. It is another object to provide a projection lens that allows imaging patterns such that their images will exhibit virtually no contrast variations due to differences in their orientations.

SUMMARY OF THE INVENTION

As a solution to these and other objects, this invention, according to one formulation, provides a method for imaging a pattern arranged in an object plane of a projection lens onto an image plane of the projection lens comprising the following steps:

illuminating the pattern with light for creating a light beam with a first light ray having a first polarization direction and a second light ray having a second polarization direction that differs from the first polarization direction;

transmitting the light beam through the projection lens, wherein the light rays of the light beam are incident on the optical components of the projection lens at differing angles of incidence and wherein a difference in the lengths of a first optical path traversed by the first light ray and a second optical path traversed by the second light ray occurs within at least one region of the image plane due to the optical configuration employed, wherein the optical configuration includes at least one birefringent optical component transited by the light beam and contributing to the difference in the lengths of the first and second optical path through birefringence; and compensating for the difference in optical path length by intentionally altering at least one of the first optical path and the second optical path such that the difference in the length of the optical path traversed by the first light ray and that traversed by the second light ray occurring within the image plane is largely independent of their angles of incidence.

Beneficial embodiments of the invention are stated in the dependent claims. The wording appearing in all of the claims is herewith made a part of the contents of this description.

In the case of the method according to the invention, the projection lens will be transited by a light beam whose electric-field vector either has a first component and a second component orthogonal thereto or an electric-field vector that may be decomposed into the orthogonal components, where the ratio of the components of the electric-field vector will determine the state of polarization of the light beam.

Rays of the light beam are incident on the optical components of the projection lens at various angles of incidence. The optical components constitute an optical system that will yield a difference in the length of a first optical path traversed by the first rays of the light beam, which have a first polarization direction, and the length of a second optical path traversed by the second rays of the light beam, which have a second polarization direction differing from the first polarization direction, over at least one region of the projection lens' image plane. According to the invention, the difference in the lengths of the optical paths will be compensated for by altering the length of the first optical path and/or the length of the second optical path such that any difference between the length of the first optical path traversed by the first ray and the length of the second optical path traversed by the second ray will be largely independent of their respective angles of incidence on the optical components.

A desired difference in the lengths of the optical paths traversed by the light rays having differing polarization directions that will depend upon the locations of the traversals and the traversal angles involved will thus be created by incorporating at least one means for optically correcting for the difference in the lengths of the optical paths that has been especially adapted to suit the projection lens, where the desired difference in the lengths of the optical paths will be such that it will exactly compensate for any undesired difference in the lengths of the optical paths caused by the other optical components of the projection lens. The difference in the lengths of the optical paths may be described in terms of a differential wavefront that will be defined at every point on the illuminated field and may vary from point to point thereon. The compensated difference in said optical path lengths cannot be further compensated employing conventional means that affect light having differing polarization directions equally and are thus incapable of compensating for any difference in their respective optical path lengths. However, means for optically correcting for same that are in accordance with the invention can be employed for compensating for those imaging errors due to stress birefringence and employment of dielectric coatings mentioned at the outset hereof and will thus improve the performance of said projection lens. The means for optically correcting for the difference in optical path length are alternatively denoted as optical correction means throughout this application. The proposed correction of the relative-phase surfaces of mutually orthogonal polarization directions will not alter the field amplitudes and thus will not adversely affect the brightnesses of partial images. On the contrary, the locations and shapes of said partial images will be altered such that all of same will occur at the same locations and have the same shapes. The effect may be achieved by arranging that the compensation will be such that light rays having mutually orthogonal polarization directions will have traversed optical paths of virtually equal length upon arrival at the image plane of the projection lens. A corresponding effect will also occur if a difference in the lengths of the optical paths that will remain constant over the range of the angles of incidence involved is introduced.

The invention is based on the recognition that the polarization-sensitive effects, in particular, such due to employment of materials exhibiting stress birefringence or employing dielectric coatings on optical components that involve large angles of incidence, will cause the wavefronts for s-polarized and p-polarized light to differ at the image plane, where the wavefronts for s-polarized and p-polarized light may be tilted with respect to one another, astigmatically distorted, defocused, and/or otherwise distorted due to various departures from design specifications and fabrication tolerances that may occur from projection lens to projection lens. Since light having differing polarization directions interfere independently, pairs of partial images that may be vertically or laterally displaced with respect to one another or displaced with respect to one another along the optical axis of the projection lens, where the displacements along the optical axis of the projection lens may also vary with the orientations of those patterns being imaged, will be created. The invention eliminates the displacements of partial images having a specific polarization in order to avoid variations in image contrast due to variations in the orientations of the patterns.

Imaging errors may also vary over the optically utilized field. The dependence upon location will lead to variations in their critical dimension (CD) over the field, which will cause the images of lines having equal widths to have widths that will vary with the latter's locations within the field, which, in turn, may further degrade the qualities of the finely patterned devices fabricated. However, the invention is also capable of eliminating these types of imaging errors.

One type of projection lens has a first, catadioptric section situated between its object plane and its image plane and a concave mirror, a beam-deflecting device, and a second, dioptric section that follows the concave mirror in the optical train. The beam-deflecting device, which is configured in the form of a reflecting prism, has a first, coated, deflecting mirror that deflects radiation coming from the projection lens' object plane to the concave mirror and a second, coated, deflecting mirror that deflects radiation reflected by the concave mirror to the second, dioptric section. The basic layout of the projection lens may correspond to that depicted in European Patent Application No. EP-A-0 989 434, which corresponds to U.S. patent application Ser. No. 09/364,382, where the concave mirror is housed in a side arm inclined at an oblique angle with respect to the principal optical axis of the projection lens involved.

In the case of reduction lenses of the type, the angles of incidence on the first, coated, deflecting mirror are larger than those on the second, coated, deflecting mirror. The inventor has determined that the predominant effect of the coatings employed on the deflecting mirrors is a tilting of the wavefronts of s-polarized and p-polarized light toward the scanning direction (y-direction). The partial images created by s-polarized and p-polarized light may be laterally separated by several nanometers due to the tilting alone, which will cause the partial images of lines oriented along the scanning direction to be effectively superimposed on one another, while the partial images of lines orthogonal to the scanning direction will be displaced, yielding pairs of parallel lines, which will smear out and broaden the images of the lines, which is why a preferred other embodiment of the highly preferable type of projection lens provides that the compensation for the difference in the optical path lengths of light rays having differing polarizations will introduce a gradient, preferably a linear gradient, in the difference in the optical path lengths transverse to the optical axis of the projection lens that will allow compensating for the tilting of the wavefronts. A suitable means for optically correcting for the tilting of the wavefronts might have at least one wedge-shaped retarding element fabricated from a birefringent material, i.e., from a material whose optical properties vary with polarization direction, where the retarding element may be fabricated from, e.g., magnesium fluoride or strained calcium fluoride. Suitably orienting a retarding element of the type in the vicinity of a pupillary plane of the projection lens, i.e. in or near that pupillary plane, will accurately compensate for any tilting of the differential wavefront due to the former's wedge shape. Adding a second wedge fabricated from an isotropic material whose optical properties are independent of polarization will then effectively transform the combination of the wedge-shaped retarding element and the second wedge into a plane-parallel plate that will have only a slight, evenly balanced, effect on light rays having either polarization direction.

As an alternative thereto, or in addition thereto, the means for optically correcting for the tilting of the wavefronts might have at least one retarding element fabricated from a birefringent material having a gradient in the difference in its refractive indices for light having the differing polarization directions transverse to the optical axis of the projection lens.

The optical correction means, i.e. the means for optically correcting for the difference in the optical path lengths of light having differing polarization directions that introduces a desired (compensating) difference in same that will depend upon the locations and angles at which the light transits the optical components of the projection lens may, in principle, be arranged anywhere within the projection lens. The means of optical correction might either consist of discrete optical components or be implemented by applying suitable coatings to existing optical components of the projection illumination system. Imaging errors that are uniformly distributed over its entire field should preferably be compensated for in the vicinity of a pupil of the projection lens, i.e. in or near that pupil plane. On the other hand, any gradients in polarization-sensitive wavefront errors should preferably be compensated for in the vicinity of, or near, a field plane of the projection lens, which will introduce a phase shift in the field components that will vary over its field plane.

The invention, in another formulation, also relates to a method for fabricating a projection lens containing optical components that introduce a difference in the optical path lengths traversed by light having differing polarization directions in the manner described at the outset hereof, where the method comprises the following steps:

configuring the projecting lens using the optical components, the optical components including at least one birefringent optical component transited by the light beam and contributing to the difference in lengths of the first and second optical path through birefringence;

transmitting light beams through the projection lens, wherein the light beams contain a first light ray and a second light ray that is orthogonally polarized with respect to the first light ray;

determining wavefronts for light rays transmitted by the projection lens, wherein a first wavefront for the first light ray and a second wavefront for the second light ray are determined in accordance with their polarizations, and the wavefronts are employed for determining differential wavefronts;

creating at least one optical correction means in accordance with the differential wavefronts, wherein the optical correction means are configured for compensating for the differences in the lengths of the optical paths such that the differential wavefronts will be largely independent of their angles of incidence on the optical components due to the compensation for the differences in the lengths of the optical paths when the optical correction means is installed in the projection lens; and installing that optical correction means in the projection lens.

In particular, the correction may be carried out such that the differential wave-front virtually vanishes.

For example, computational simulations based on measured material parameters, such as the characteristics of coatings, may serve as a basis for fabricating a means for the optical correction, in which case, the layout of the projection lens and ray tracing may be carried out entirely with computer assistance or virtually carried out. Determination of the differential wavefront and designing suitable means for optically correcting for same may also be carried out entirely with computer assistance or virtually carried out.

However, the differential wavefront may also be empirically determined using an actual, fully assembled, projection lens. For example, transmitted wavefronts or ray paths may be measured independently for each polarization direction using a polarizer and a polarization analyzer. The resultant measurements on an actual, fully assembled, projection lens may be employed in fabricating a compensating element that has been tailored to suit same that may then be installed therein.

Prospective compensating effects of the means of optical correction according to the invention are not confined to the compensation for wavefront tilting that has have been described above in terms of examples. For example, concentric differential-wavefront aberrations, such as those that may occur when polarized light transits antireflection coatings on lenses at large angles of incidence, are also correctable, either alternatively, or in addition thereto. Employing more complexly shaped and/or strained means of optical correction and/or more complexly configured gradients in their birefringent effects will allow compensating for arbitrary distortions of the differential wavefront of s-polarized and p-polarized light.

BRIEF DESCRIPTION OF THE DRAWINGS

The preceding and other properties may be seen both in the claims and in the description and the drawings, wherein the individual characteristics involved may be used either alone or in sub-combinations as an embodiment of the invention and in other areas, and may individually represent advantageous and patentable embodiments.

DETAILED DESCRIPTION OF THE PREFERRED EMBODIMENTS

Figure 1:
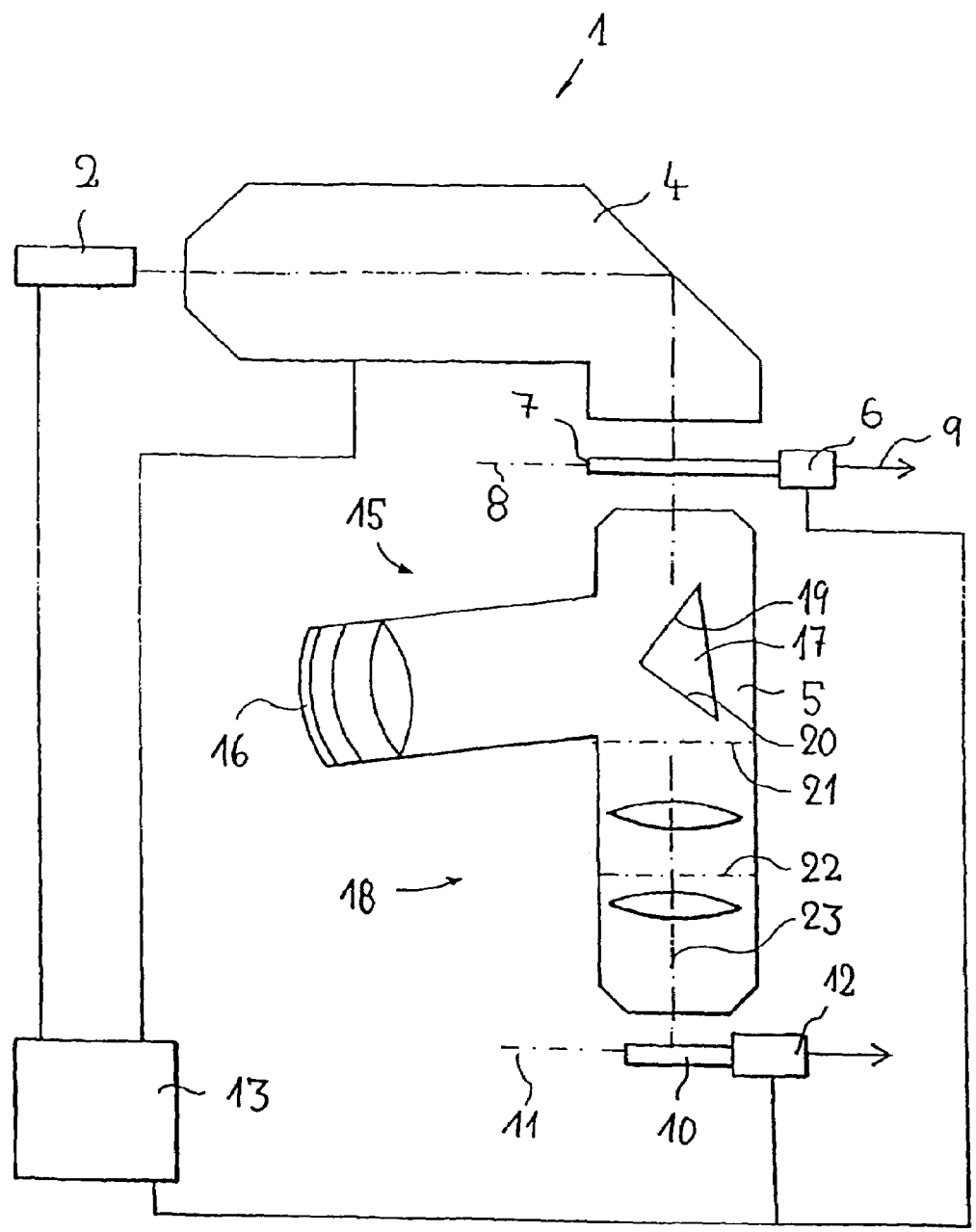
FIG. 1 is a schematized representation of a microlithographic projection illumination system equipped with a projection lens according to the invention, where the system has been configured in the form of a wafer stepper.

FIG. 1 schematically depicts a microlithographic projection illumination system 1 in the form of a wafer stepper employed for fabricating VLSI semiconductor de-vices. The projection illumination system includes an excimer laser 2 that serves as its light source. An illumination system 4 generates a large, sharply delimited, and highly uniformly illuminated image field that has been adapted to suit the telecentricity requirements of the projection lens 5 that follows it in the optical train. The illumination system 4 is equipped with means for selecting an illumination mode and is, for example, capable of being switched between conventional illumination with a variable degree of spatial coherence, annular illumination, and dipole or quadrupole illumination. The illumination system is followed by a device 6 for clamping and manipulating a reticle 7 that is arranged such that the reticle lies in the object plane 8 of the projection lens and may be translated along a direction of travel 9 (the y-direction) lying in the plane by a scanning drive. The plane 8 of the reticle is followed by the reduction lens 5, which projects an image of the reticle whose linear dimensions have been scaled down by a factor of ¼ or ⅕ onto a wafer 10 coated with a layer of photoresist that is arranged in the image plane 11 of the reduction lens 5. The wafer 10 is held in place by a device 12 that includes a scanning drive in order to allow synchronously translating the wafer parallel to the reticle 7. All of the systems are controlled in known manners by a controller 13.

The projection lens 5 has a catadioptric, first section 15 having a concave mirror 16 and a beam-deflecting device 17 that are followed by a dioptric, second section 18 situated between its object plane 8, i.e., the plane of the mask, and its image plane 11, i.e., the plane of the wafer. The beam-deflecting device 17, which has been configured in the form of a reflecting prism, has a first reflecting surface 19 for deflecting radiation coming from the object plane to the concave mirror 16 and a second reflecting surface 20 for deflecting radiation reflected by the concave mirror 16 toward the purely refractive second section 18. The catadioptric section has been designed such that a readily accessible intermediate image that will be imaged onto the image plane 11 by the dioptric section will be formed in the vicinity of an intermediate image plane 21 that follows the second deflecting mirror 20 in the optical train and is located at a considerable distance therefrom. A pupillary plane 22 of the projection lens lies between the intermediate image plane 21 and the image plane 11.

The basic design of the projection lens may correspond to that depicted in European Pat. No. EP-A-0 989 434. Insofar as same shall apply, those disclosures appearing in the document are herewith made an integral part of this description. A special feature of the lens design is that the concave mirror 16 is housed in a side arm of the projection lens that is inclined an oblique angle thereto, which, among other things, will provide for an adequately large working distance over its full entrance aperture, i.e., over the full width of the mask. Since the inclination angles of the first deflecting mirror 19 and the second deflecting mirror 20 relative to the lens' optical axis 23, which passes through the object plane 8 and is normal to same, will thus differ from 45°, the deflection angle of the first deflecting mirror will exceed 90°.

The projection illumination system has been designed to provide spatial resolutions of 0.2 μm or less and high light throughputs at operating wavelengths shorter than about 260 nm, in particular, at operating wavelengths of 193 nm or 157 nm, and has a numerical aperture (NA) of around 0.5 to around 0.9. In view of the short wavelengths involved, its transparent optical components will be fabricated from quartz glass and/or crystalline fluoride materials, such as calcium fluoride, where either a single such material or combinations of several such materials might be employed, depending upon the design of the illumination system. However, since those types of materials involved here exhibit stress birefringence, the mutually orthogonal (s-plane/p-plane) components of the electric-field vectors of light transmitted by the illumination system may be differently affected. Moreover, the design depicted therein employs deflecting mirrors 19, 20 that have reflectivity-enhancing dielectric overcoatings. Although those employed on the sample embodiment depicted there are magnesium-fluoride single layer coatings, multilayer coatings might well be employed on other embodiments of same.

Figure 2:
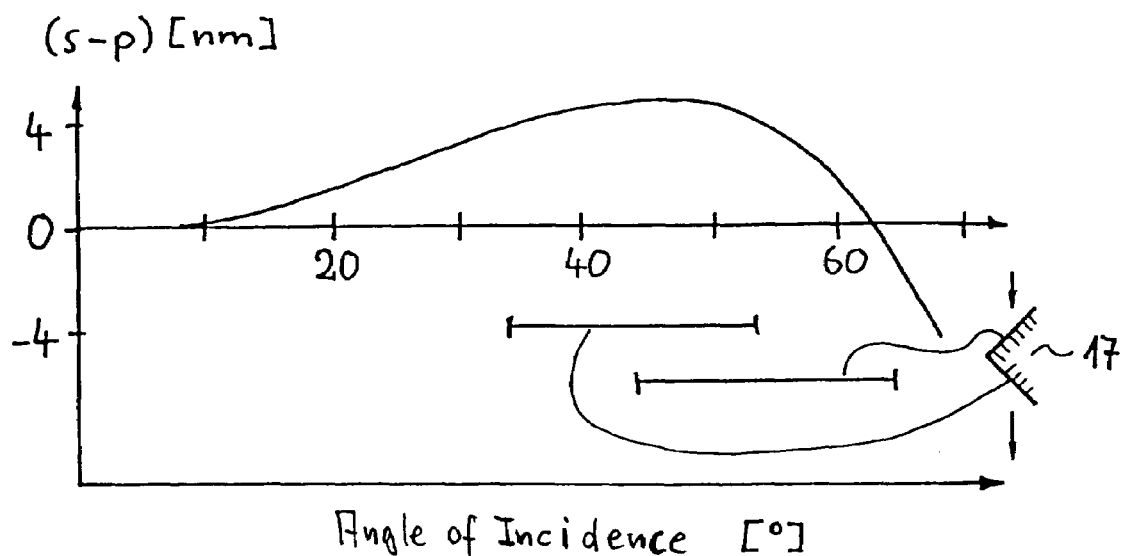
FIG. 2 is a plot of the difference in the lengths of those optical paths traversed by s-polarized and p-polarized light reflected by a mirror having a reflective coating as a function of angle of incidence.

Employment of the types of highly reflective coatings (HR-coatings) on the deflecting mirrors will yield polarization-dependent phase shifts between s-polarized and p-polarized light rays reflected by the mirrors that will vary with their angle of incidence on same, since they will cause differences in the lengths of the optical paths traversed by the light rays that will vary with the angles of incidence. In the case of the sample embodiment under consideration here, the angles of incidence on the first deflecting mirror 19 will exceed those for the second deflecting mirror 20 due to the off-axis inclination of the side arm housing the concave mirror 16. As may be seen from the plot appearing in FIG. 2, the angles of incidence will range from around 45° to around 65° in the case of the first deflecting mirror 19 and from around 35° to around 55° in the case of the second deflecting mirror 20. FIG. 2 also includes a plot of the difference, s-p, in the lengths of those optical paths traversed by s-polarized and p-polarized light as a function of angle of incidence, indicated by the continuous curve, where it may be seen that the first deflecting mirror 19 is largely responsible for causing the differences in the lengths of the optical paths traversed by s-polarized and p-polarized light. The difference in the optical path lengths will thus be positive in the case of those rays of divergent light beams that are incident on the deflecting mirrors at relatively small angles of incidence and negative in the case of light rays that are incident on same at relatively large angles of incidence. A constant phase shift between the s-polarized and p-polarized light will, however, not adversely affect the intensity in the image plane, which means that the second deflecting mirror 20 will be less critical in the case of the sample embodiment under consideration here.

Figure 3:
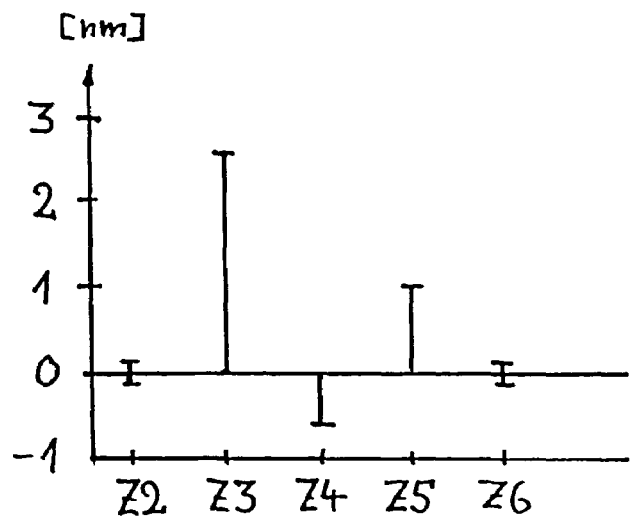
FIG. 3 is a plot schematically indicating the order of magnitude of the s-polarized/p-polarized differential wavefront of light reflected by a pair of deflecting mirrors, decomposed into Zernike coefficients.

From FIG. 3, it should be evident that, in the case of the sample embodiment depicted in FIG. 1 hereof, the predominant effect of the deflecting mirrors 19, 20 on the differential wavefront for s-polarized/p-polarized light will be a tilting of same along the scanning direction (the y-direction). In order to further clarify the matter, FIG. 3 presents plots of the orders of magnitude (expressed in length units) of several low-order Zernike coefficients, Z2–Z6, of the differential wavefront for s-polarized/p-polarized light for that projection illumination system described here in terms of a sample embodiment. It may be seen that the major contribution comes from Zernike coefficient Z3, which describes the inclination of the differential wavefront along the y-direction. Computations indicate that the partial images created by s-polarized and p-polarized light may be displaced with respect to one another by as much as about 4 nm as a result of this effect alone, which will cause the images of lines on the pattern on the mask that are aligned along the scanning or translation axis to be fairly accurately superimposed on one another, i.e., unbroadened, while those lines on same that are orthogonal to the axis will yield parallel double images, which, in turn will result in a smearing out and broadening of the images of the lines and variations (H-V-variations) in the imaged widths of the lines that will depend upon their respective orientations.

The differing angles of incidence of the light beams at differing locations on the deflecting mirrors will also cause those imaging errors described here to vary over their reflecting surfaces, i.e., will also cause the imaging errors to vary over the optically used field. An example of the variation is presented in FIG. 4, which depicts a plot of the variation of the predominant Zernike coefficient, Z3, of the differential wavefront for s-polarized/p-polarized light over the optically utilized field, where the x-axis and y-axis of the plot have been graduated in arbitrary units. It may be seen that the order of magnitude of the tilting error involved, which is represented by the Zernike coefficient, Z3, remains roughly constant normal to the scanning direction, i.e., along the x-axis, and varies roughly linearly along the scanning direction, i.e., along the y-axis.

In order to compensate for the effects, projection lenses according to the invention incorporate means for optically correcting for same that introduce a desired difference in the optical path lengths traversed by light having differing polarization directions that will depend upon the locations and angles at which the light transits the means for optically correcting for same. The means of optical correction will preferably be present in the form of components that have been specially adapted to suit the particular projection lens involved. However, the means of optical correction may also applied to optical components of the lens that are already present anyhow in the form of, e.g., suitably designed, differing coatings for the first and second deflecting mirrors.

Although the means of optical correction may be incorporated, or arranged, anywhere within the projection lenses, it will be beneficial if imaging errors that remain the same over the entire optical field cf. FIG. 3 are corrected in the vicinity of a pupillary plane, e.g., in the vicinity of that pupillary plane 22 mentioned above, or the vicinity of the concave mirror 16. In order to correct for any gradients in the polarization-dependent wavefront distortions, it will be preferable if at least one means of optically correcting for same is incorporated near the field, i.e., in the vicinity of the intermediate image plane 21, as has been explained above in conjunction with FIG. 4.

Figure 5:
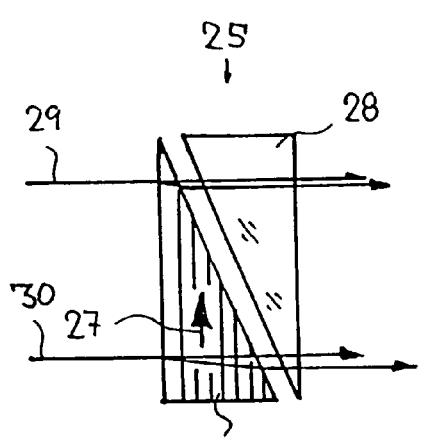
FIG. 5 is a schematized representation of a first embodiment of a means of optical correction for compensating for a tilting of a differential wavefront.

Means of optical correction of the type considered here should preferably be fabricated such that they will be polarization-sensitive but have the same, as slight as possible, effects on either polarization direction, and will thus create few, undesired, imaging errors. The means of optical correction should preferably be partly, or entirely, fabricated from birefringent materials, such as magnesium fluoride or suitably strained calcium fluoride. One sample embodiment of a means 25 for optically correcting for a tilting of the differential wavefront is schematically depicted in FIG. 5. The means essentially consists of a wedge-shaped retarding element 26 fabricated from a birefringent material whose crystallographic axis 27 is aligned along the direction of its taper, i.e., along the direction of increasing or decreasing axial thickness. The retarding element 26, which has the same basic shape as a comparator plate, is backed by a contrarily tapered, wedge-shaped element 28 fabricated from an optically isotropic material, such as unstrained calcium fluoride, thereby effectively creating a plane-parallel plate. The wedge-shaped elements may be joined either by optically contacting same or by cementing same together. The polarization-insensitive element 28 may also be separated from the wedge-shaped retarding element 26 and arranged at some other suitable location within the projection lens.

Figure 4:
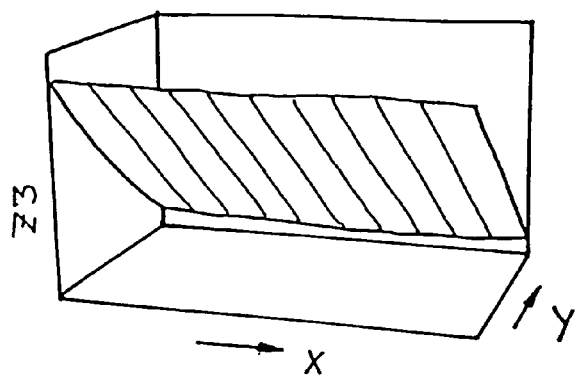
FIG. 4 is a schematized plot indicating the shape of an s-polar-ized/p-polarized differential wavefront having a Zernike coefficient, Z3, falling within that range shown in FIG. 3 over the optically utilized field.

If a light beam transits the means of optical correction along a direction orthogonal to the crystallographic axis 27 of the wedge-shaped retarding element 26, the differences in the optical path lengths for light rays 29 having the polarization directions transmitted by the wedge-shaped retarding element 26 in the vicinity of its thinner edge will be much less than those for light rays 30 having the polarization directions transmitted by same in the vicinity of its thicker edge. Suitably choosing the algebraic sign and magnitude of the difference in optical path lengths thereby created and suitably arranging and orienting the means of optical correction, e.g., near a pupillary plane 22, may allow exactly compensating for a tilting of the differential wave-front, represented by its pupillary Zernike coefficient, Z3 cf. FIG. 3. Any additional dependence of the difference in optical path lengths for the polarization directions on the angles at which the light rays transit the means of optical correction may be at least partially offset by the spatial variation of the Zernike coefficient, as indicated in FIG. 4. The second wedge-shaped element 28, whose effect is independent of polarization direction, effectively transforms the first wedge-shaped element into a plane-parallel plate that will have the same, slight, effect on either polarization direction. The means 25 of optical correction will also introduce a linear gradient in the difference in the lengths of the optical paths for the electric-field components orthogonal to the direction along which same is transited.

As described in the Internet publication "Preliminary Determination of an Intrinsic Birefringence in $CaF_2$" by John H. Burnett, Eric L. Shirley, and Zachary H. Levine of the National Institute of Standards and Technology (NIST), Gaithersburg, Md. (posted on May 7, 2001), single crystal ingots of calcium fluoride also exhibit birefringence that is not stress-induced, i.e., intrinsic birefringence. According to the measurements presented in that study, a light ray traveling in the <110> direction of the calcium fluoride crystal is subject to a birefringence that amounts to 6.5.+−0.0.4 nm/cm at a wavelength of $\lambda$=156.1 nm, to 3.6.+−0.0.2 nm/cm at a wavelength of $\lambda$=193.09 nm, and to 1.2.+−0.0.1 nm/cm at a wavelength of $\lambda$=253.65 nm. On the other hand, if the light propagation is oriented in the <100> direction or in the <111> direction of the crystal, no intrinsic birefringence occurs in calcium fluoride, as is also predicted by theory. Thus, the intrinsic birefringence has a strong directional dependence and increases significantly for shorter wavelengths.

Measurements made by the applicant have confirmed the intrinsic birefringence of calcium fluoride as reported by the NIST researchers, except for the wavelength of $\lambda$=156.1 nm, where a birefringence of 11 nm/cm was measured for a ray propagating in the <110> direction of the crystal.

Figure 6:
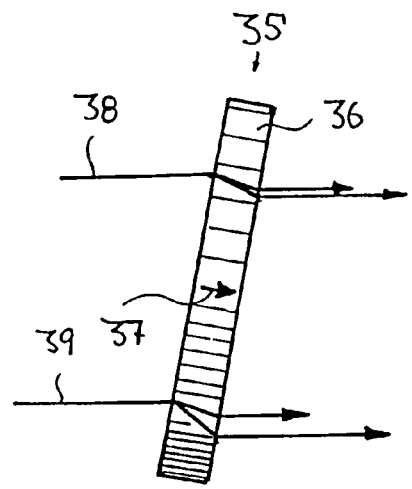
FIG. 6 is another embodiment of a means of optical correction for compensating for a tilting of a differential wavefront.

Another embodiment of an means of optical correction for compensating for the tilting of the differential wavefront is depicted in FIG. 6. The means 35 essentially consists of a plane-parallel plate 36 fabricated from a birefringent material whose crystallographic axis 37 is orthogonal to the plane of the plane-parallel plate, where the material from which the plate is fabricated has been chosen, or treated, such that the plate will have a spatial variation in its birefringent effects, which, in the case of the sample embodiment depicted therein, is a linear increase in the difference in its refractive indices from its upper edge to its lower edge. On the whole, the means of optical correction will again act as a plane-parallel plate. However, when installed in the projection lens, the plate will be oriented at an angle with respect to the transmission direction such that light transmitted by same will propagate at an oblique angle to the crystallographic axis 37.

The optical effect of the means of optical correction 35 is similar to that of the sample embodiment depicted in FIG. 5. The differences in the lengths of those optical paths traversed by light rays 38 having differing polarizations transiting its upper, less birefringent, portion will be less than those for light rays 39 transiting its lower, more birefringent, portion. On the whole, the aforementioned tilting of the differential wave-front may be compensated for in this manner, provided that the magnitude and orientation of the spatial variation in the birefringent effects have been suitably chosen. Again, if such a means of optical correction is arranged in the vicinity of the system pupil 22 in order to allow compensating for the tilting of the differential wavefront, a variation in the difference in the optical path lengths traversed by light having the differing polarization directions that will depend upon the angles at which it transits the means of optical correction that may be utilized to yield a reduction in the dependence on the location.

Figure 7:
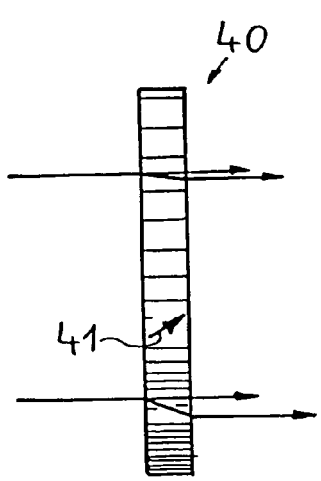
FIG. 7 is yet another embodiment of a means of optical correction for compensating for a tilting of a differential wavefront.

The same optical effect may also be obtained by employing a plane-parallel plate 40 having a spatial variation in its birefringent effects that has been cut at an angle to its crystallographic axis 41 such that it will be optically polarization-sensitive when installed untilted in the projection lens in the manner described above cf. FIG. 7.

Instead of, or in addition to, the aforementioned corrections for tilting of differential wavefronts, the invention may also be utilized for compensating for typical con-centric distortions of differential wavefronts. Concentrically distorted differential wavefronts are distinguished by the fact that their optical path lengths for light having differing polarization directions vary radially with respect to an optical axis of the system involved such that, e.g., differences in the path lengths for s-polarized and p-polarized light propagating near the optical axis will be greater or less than those occurring at the edges of zones transited by same. In particular, differences in optical path lengths of the type may be caused by antireflection coatings on lenses that are transited by light at large angles of incidence. Although the differences in the path lengths caused by a single antireflection coatings will typically be relatively small, e.g., of order <1 nm, e.g., modern microlithographic projection lenses incorporate numerous lenses that are transited by light at large angles, and thus have numerous such coatings whose effects can add up. Concentric differential wavefront distortions of the aforementioned type may play a dominant role in the case of axisymmetric projection lenses, i.e., particularly in the case of systems containing refractive optics only. However, in the case of catadioptric systems, one example of which will be de-scribed here, the differences in optical path lengths may be superimposed on differ-ences in optical path lengths caused by their mirrors.

Figure 8:
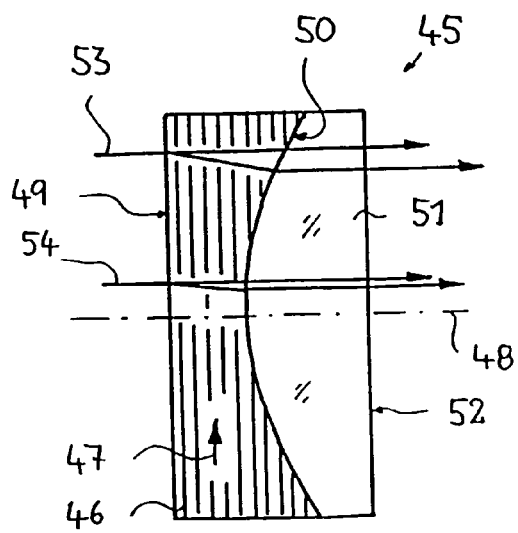
FIG. 8 is a means of optical correction for compensating for a concentric differential wavefront.

FIG. 8 schematically depicts a means 45 for optically compensating for a spherical aberration of the differential wavefronts. The means includes a circular retarding element 46 fabricated from a birefringent material whose crystallographic axis 47 is orthogonal to the central symmetry axis 48 of the element. The retarding element has a planar entrance face 49 and a spherical exit face 50 that is curved with respect to the entrance face such that its axial thickness is less at its center than at its edges. Adding an optically isotropic element 51 having a spherical entrance face that is cemented to the spherical exit face of the retarding element 46 and a planar exit face 52 yields a plane-parallel compensator 45.

If light transits the compensator parallel to its optical axis 48, the differences in the optical paths for light having the differing polarization directions upon exiting same will be much greater for light rays 53 that transit the compensator near its edges than for light rays 54 that transit same near its center, which will allow compensating for concentric differential-wavefront distortions, such as those represented by Zernike coefficients Z4, Z9, and Z16.

Although the principle underlying the invention has been described here based on the examples of compensating for a tilting of the differential wavefronts and concentric differential wavefront distortions, other, possible, types of compensation employing means of optical correction in accordance with the invention are not limited to compensating for the types of differential-wavefront distortions. Employing more complexly shaped and/or strained means of optical correction and/or more complexly configured gradients in the birefringent effects of their retarding elements will allow compensating for arbitrary distortions of the differential wavefronts for s-polarized and p-polarized light. Of course, several means of optical correction according to the invention may also be sequentially arranged along beam paths in order to arrive at more complex sorts of corrections.

Computational simulations based on measured material parameters, such as the characteristics of reflective coatings, may be employed as a basis for fabricating compensating elements of the type. Compensators according to the invention may thus be taken into account right from the start in conjunction with the computer-assisted design of projection lenses. Empirical approaches to designing suitable compensators are also possible. For example, transmitted wavefronts or ray paths may be measured independently for each polarization direction using a polarizer and a polarization analyzer on a fully assembled projection lens that does not yet incorporate any means for optically correcting for same according to the invention. The resultant measurements on an actual, fully assembled, projection lens may then be employed in fabricating a compensator that has been tailored to suit same that may then be installed, correctly oriented, at a suitable location therein.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

What is claimed is:

1. A method for compensating wavefront deformations in a projection lens that includes at least one birefringent optical component and that is provided for imaging a pattern arranged in an object plane of the projection lens onto an image plane of the projection lens comprising:
    illuminating the pattern with light for creating a light beam with a first light ray having a first polarization direction and a second light ray having a second polarization direction that differs from the first polarization direction;
    transmitting the light beam through the projection lens, wherein the light rays of the light beam are incident on the optical components of the projection lens at differing angles of incidence and wherein a difference in the lengths of a first optical path traversed by the first light ray and a second optical path traversed by the second light ray occurs within at least one region of the image plane due to the optical configuration employed, wherein the optical configuration includes at least one birefringent optical component transited by the light beam and contributing to the difference in the lengths of the first and second optical path through birefringence; and
    compensating for the difference in optical path length by intentionally altering at least one of the first optical path and the second optical path such that the difference in the length of the optical path traversed by the first light ray and the length of the optical path traversed by the second light ray occurring within the image plane is largely independent of the angles of incidence of the light rays.

2. The method according to claim 1, wherein said compensating for the difference in the lengths of the optical paths of the light rays comprises:
    introducing a non-rotational symmetric gradient in the difference in the length of the optical paths of the light rays, the gradient being oriented orthogonal to an optical axis of the projection lens.

3. The method according to claim 2, wherein the gradient is substantially linear, whereby a tilting of wavefronts running through the projection lens is at least partly compensated.

4. The method according to claim 1, wherein said compensating for the difference in the lengths of the optical paths of the light rays comprises:
    introducing a substantially spherical gradient in the difference in the length of the optical paths of the light rays, the gradient being concentric with an optical axis of the projection lens.

5. The method according to claim 1, wherein the compensation for the difference in the lengths of the optical paths is introduced in a vicinity of a pupil plane of the projections lens.

6. The method according to claim 1, wherein the compensation for the difference in the lengths of the optical paths is introduced in a vicinity of a field plane of the projection lens such that a phase shift between the light rays having differing polarizations that varies over the field plane is introduced in conjunction with the compensation.

7. The method according to claim 6, wherein the compensation is introduced in a vicinity of an intermediate image.

8. The method according to claim 2, wherein the compensation for the difference in the lengths of the optical paths is introduced in a vicinity of a pupil plane of the projections lens.

9. The method according to claim 2, wherein the compensation for the difference in the lengths of the optical paths is introduced in a vicinity of a field plane of the projection lens such that a phase shift between the light rays having differing polarizations that varies over the field plane is introduced in conjunction with the compensation.

10. A projection lens for a microlithographic projection system for imaging a pattern arranged in an object plane onto an image plane of the projection lens employing light that contains a first light ray having a first polarization direction and a second light ray having a second polarization direction that differs from the first polarization direction,
    the projection lens comprising optical components that may be illuminated by transmitted light rays at varying angles of incidence, the optical components including at least one mirror having a mirror surface inclined with respect to the optical axis and arranged between the object plane and the image plane;
    wherein a difference in the length of a first optical path traversed by the first light ray and a second optical path traversed by the second light ray occurs within at least one region of the image plane due to the optical configuration of the optical components;
    the projection lens further comprising at least one optical correction means for correcting for differences in the optical path length of the light rays by altering at least one of the first optical path and the second optical path;
    the optical correction means being configured such that the difference in the optical path length occurring at the image plane is largely independent of the angles of incidence of the light rays on the optical components.

11. The projection lens according to claim 10, wherein the optical correction means are configured for creating a non-rotational symmetric gradient in a phase shift between the light rays having differing polarization directions, the gradient being oriented roughly orthogonal to the optical axis of the projection lens.

12. The projection lens according to claim 11, wherein the optical correction means are configured for creating a substantially linear gradient of the phase shift, whereby a tilting of wavefronts running through the projection lens is at least partly compensated.

13. The projection lens according to claim 11, wherein the optical correction means include at least one wedge-shaped retarding element fabricated from a birefringent material.

14. A projection means according to claim 11, wherein the optical correction means include a retarding element fabricated from a birefringent material and an optical element fabricated from an optically isotropic material, wherein the optically isotropic optical element is shaped complementary to the retarding element and is aligned with respect to the the retarding element such that the retarding element and the optically isotropic optical element form a plane-parallel optical element.

15. A projection lens according to claim 11, wherein the optical correction means include at least one retarding element fabricated from a birefringent material having a gradient of the refractive index transverse to the optical axis of the projection lens.

16. A projection lens according to claim 11, wherein the optical correction means have the overall shape of a plane-parallel plate.

17. A projection lens according to claim 11, wherein the projection lens is a catadioptric projection lens having at least one concave mirror and at least one deflecting mirror inclined with respect to the optical axis and arranged between the object plane and image plane.

18. A projection lens according to claim 11, further comprising at least one pupillary surface, wherein at least one optical correction means is arranged in the vicinity of the pupillary surface.

19. A projection lens according to claim 11, comprising at least one real intermediate image situated in the vicinity of an intermediate image plane between the object plane and the image plane, wherein at least one optical correction means is arranged in the vicinity of the intermediate image plane.

20. The projection lens according to claim 10, wherein the optical correction means are configured for creating a substantially spherical gradient of the phase shift, the gradient being concentric with the optical axis of the correction means.

21. The projection lens according to claim 20, wherein the optical correction means include a retarding element fabricated from a birefringent material that is axially bounded by a planar surface on one axial end and a curved surface on the opposite axial end.

22. The projection lens according to claim 10, wherein the optical correction means include a retarding element fabricated from a birefringent material and an optical element fabricated from an optically isotropic material, wherein the optically isotropic optical element is shaped complementary to the retarding element and is aligned with respect to the the retarding element such that the retarding element and the optically isotropic optical element form a plane-parallel optical element.

23. The projection lens according to claim 10, wherein the optical correction means include at least one retarding element fabricated from a birefringent material having a gradient of the refractive index transverse to the optical axis of the projection lens.

24. The projection lens according to claim 10, wherein the optical correction means have the overall shape of a plane-parallel plate.

25. The projection lens according to claim 10, wherein the projection lens is a catadioptric projection lens having at least one concave mirror having a mirror surface inclined with respect to the optical axis.

26. The projection lens according to claim 10, wherein the projection lens is a catadioptric projection lens having at least one deflecting mirror having a planar mirror surface inclined with respect to the optical axis.

27. The projection lens according to claim 10, wherein the projection lens is a catadioptric projection lens having at least one concave mirror and at least one deflecting mirror inclined with respect to the optical axis and arranged between the object plane and image plane.

28. The projection lens according to claim 27, further comprising a catadioptric first section having a concave mirror and a beam-deflecting device and a dioptric second section following the first section, wherein the beam-deflecting device has a first reflecting surface for deflecting radiation coming from the object plane to the concave mirror and a second reflecting surface for deflecting radiation reflected by the concave mirror toward the second section.

29. The projection lens according to claim 28, wherein the first deflecting mirror is oriented at an angle with respect to the optical axis of the projection lens, the angle deviating from 45° such that an angle through which it deflects incident radiation to the concave mirror is greater than 90°.

30. A projection lens according to claim 27, further comprising at least one pupillary surface, wherein at least one optical correction means is arranged in the vicinity of the pupillary surface.

31. A projection lens according to claim 27, comprising at least one real intermediate image situated in the vicinity of an intermediate image plane between the object plane and the image plane, wherein at least one optical correction means is arranged in the vicinity of the intermediate image plane.

32. A projection lens according to claim 27, wherein the optical correction means are configured for creating a non-rotational symmetric gradient in a phase shift between the light rays having differing polarization directions, the gradient being oriented roughly orthogonal to the optical axis of the projection lens.

33. A projection lens according to claim 27, wherein the optical correction means are configured for creating a substantially spherical gradient of the phase shift, the gradient being concentric with the optical axis of the correction means.

34. A projection lens according to claim 27, wherein the optical correction means include a retarding element fabricated from a birefringent material and an optical element fabricated from an optically isotropic material, wherein the optically isotropic optical element is shaped complementary to the retarding element and is aligned with respect to the retarding element such that the retarding element and the optically isotropic optical element form a plane-parallel optical element.

35. A projection lens according to claim 27, wherein the optical correction means include at least one retarding element fabricated from a birefringent material having a gradient of the refractive index transverse to the optical axis of the projection lens.

36. A projection lens according to claim 27, wherein the optical correction means have the overall shape of a plane-parallel plate.

37. The projection lens according to claim 10, further comprising at least one pupillary surface, wherein at least one optical correction means is arranged in the vicinity of the pupillary surface.

38. The projection lens according to claim 10, comprising at least one real intermediate image situated in the vicinity of an intermediate image plane between the object plane and the image plane, wherein at least one optical correction means is arranged in the vicinity of the intermediate image plane.

39. The projection lens according to claim 10, wherein the optical correction means include at least one birefringent component that is a transparent optical component made of a fluoride crystal.

40. The projection lens according to claim 39, wherein the fluoride crystal is calcium fluoride.

41. The projection lens according to claim 10, wherein the optical correction means include at least one birefringent component that is a transparent optical component made of a material exhibiting stress birefringence and mounted in a stressed manner.

42. The projection lens according to claim 10, wherein the projection lens is a catadioptric projection lens having at least one concave mirror.

43. The projection lens according to claim 42, wherein the optical correction means are configured for creating a non-rotational symmetric gradient in a phase shift between the light rays having differing polarization directions, the gradient being oriented roughly orthogonal to the optical axis of the projection lens.

44. The projection lens according to claim 43, wherein the optical correction means are configured for creating a substantially linear gradient of the phase shift, whereby a tilting of wavefronts running through the projection lens is at least partly compensated.

45. The projection lens according to claim 43, wherein the optical correction means include at least one wedge-shaped retarding element fabricated from a birefringent material.

46. A projection lens according to claim 43, wherein the optical correction means include a retarding element fabricated from a birefringent material and an optical element fabricated from an optically isotropic material, wherein the optically isotropic optical element is shaped complementary to the retarding element and is aligned with respect to the the retarding element such that the retarding element and the optically isotropic optical element form a plane-parallel optical element.

47. A projection lens according to claim 43, wherein the optical correction means include at least one retarding element fabricated from a birefringent material having a gradient of the refractive index transverse to the optical axis of the projection lens.

48. A projection lens according to claim 43, wherein the optical correction means have the overall shape of a plane-parallel plate.

49. A projection lens according to claim 43, wherein the projection lens is a catadioptric projection lens having at least one concave mirror and at least one deflecting mirror inclined with respect to the optical axis and arranged between the object plane and image plane.

50. A projection lens according to claim 43, further comprising at least one pupillary surface, wherein at least one optical correction means is arranged in the vicinity of the pupillary surface.

51. A projection lens according to claim 43, comprising at least one real intermediate image situated in the vicinity of an intermediate image plane between the object plane and the image plane, wherein at least one optical correction means is arranged in the vicinity of the intermediate image plane.

52. The projection lens according to claim 42, wherein the optical correction means are configured for creating a substantially spherical gradient of the phase shift, the gradient being concentric with the optical axis of the correction means.

53. The projection lens according to claim 52, wherein the optical correction means include a retarding element fabricated from a birefringent material that is axially bounded by a planar surface on one axial end and a curved surface on the opposite axial end.

54. The projection lens according to claim 42, wherein the optical correction means include a retarding element fabricated from a birefringent material and an optical element fabricated from an optically isotropic material, wherein the optically isotropic optical element is shaped complementary to the retarding element and is aligned with respect to the the retarding element such that the retarding element and the optically isotropic optical element form a plane-parallel optical element.

55. The projection lens according to claim 42, wherein the optical correction means include at least one retarding element fabricated from a birefringent material having a gradient of the refractive index transverse to the optical axis of the projection lens.

56. The projection lens according to claim 42, wherein the optical correction means have the overall shape of a plane-parallel plate.

57. The projection lens according to claim 42, further comprising at least one planar deflecting mirror inclined with respect to the optical axis.

58. The projection lens according to claim 42, further comprising a catadioptric first section having a concave mirror and a beam-deflecting device and a dioptric second section following the first section, wherein the beam-deflecting device preferably has a first reflecting surface for deflecting radiation coming from the object plane to the concave mirror and a second reflecting surface for deflecting radiation reflected by the concave mirror toward the second section.

59. A projection lens according to claim 42, further comprising at least one pupillary surface, wherein at least one optical correction means is arranged in the vicinity of the pupillary surface.

60. A projection lens according to claim 42, comprising at least one real intermediate image situated in the vicinity of an intermediate image plane between the object plane and the image plane, wherein at least one optical correction means is arranged in the vicinity of the intermediate image plane.

61. A projection lens according to claim 42, wherein the optical correction means are configured for creating a non-rotational symmetric gradient in a phase shift between the light rays having differing polarization directions, the gradient being oriented roughly orthogonal to the optical axis of the projection lens.

62. A projection lens according to claim 42, wherein the optical correction means are configured for creating a substantially spherical gradient of the phase shift, the gradient being concentric with the optical axis of the correction means.

63. A projection lens according to claim 42, wherein the optical correction means include a retarding element fabricated from a birefringent material and an optical element fabricated from an optically isotropic material, wherein the optically isotropic optical element is shaped complementary to the retarding element and is aligned with respect to the the retarding element such that the retarding element and the optically isotropic optical element form a plane-parallel optical element.

64. A projection lens according to claim 42, wherein the optical correction means include at least one retarding element fabricated from a birefringent material having a gradient of the refractive index transverse to the optical axis of the projection lens.

65. A projection lens according to claim 42, wherein the optical correction means have the overall shape of a plane-parallel plate.

66. A method for fabricating a projection lens comprising optical components and being usable for transmitting light containing a first light ray having a first polarization direction and a second light ray having a second polarization direction that differs from the first polarization direction, wherein the optical components may be illuminated by a transmitted light beam containing light rays having differing angles of incidence on the optical components and wherein a difference in the lengths of a first optical path traversed by the first light ray and a second optical path traversed by the second light ray occurs within at least one region of the image plane of the projection lens due to the optical configuration employed, wherein the method comprises:

configuring the projecting lens using the optical components, the optical components including at least one birefringent optical component transited by the light beam and contributing to the difference in lengths of the first and second optical path through birefringence;

transmitting light beams through the projection lens, wherein the light beams contain a first light ray and a second light ray that is orthogonally polarized with respect to the first light ray;

determining wavefronts for light rays transmitted by the projection lens, wherein a first wavefront for the first light ray and a second wavefront for the second light ray are determined in accordance with their polarizations, and the wavefronts are employed for determining differential wavefronts;

creating at least one optical correction means in accordance with the differential wavefronts, wherein the optical correction means are configured for compensating for the differences in the lengths of the optical paths such that the differential wavefronts will be largely independent of their angles of incidence on the optical components due to the compensation for the differences in the lengths of the optical paths when the optical correction means is installed in the projection lens; and installing that optical correction means in the projection lens.

67. The method according to claim 66, wherein the configuration and illumination of the projection lens, the determinations of the wavefronts and the differential wavefronts, and the creation of at least one means of optical correction, are performed computer-assisted.

68. The method according to claim 67, wherein at least one optical correction means is fabricated based on parameters that have been determined with the assistance of a computer.

69. The method according to claim 66, wherein the differential wavefront is empirically determined on an actual, fully assembled projection lens employed for empirically determining the parameters for fabricating the means of optical correction and the means of optical correction is fabricated based on the empirically determined parameters.

70. The method according to claim 66, wherein the birefringent component is a transparent optical component made of a fluoride crystal.

71. The method according to claim 70, wherein the fluoride crystal is calcium fluoride.

72. The method according to claim 66, wherein the birefringent component is a transparent optical component made of a material exhibiting stress birefringence and being mounted in a stressed manner.

73. An optical corrector for installation in a projection lens for a microlithographic projection system for imaging a pattern arranged in an object plane onto an image plane of the projection lens employing light that contains a first light ray having a first polarization direction and a second light ray having a second polarization direction that differs from the first polarization direction, the projection lens comprising optical components that may be illuminated by transmitted light rays at varying angles of incidence, the optical components including at least one birefringent optical component transited by the light and contributing to the difference in length of the first and second optical path through birefringence, wherein a difference in the length of a first optical path traversed by the first light ray and a second optical path traversed by the second light ray occurs within at least one region of the image plane due to the optical configuration of the optical components, the optical corrector being adapted for correcting for differences in the optical path length of the light rays by altering at least one of the first optical path and the second optical path, the optical corrector being configured such that the difference in the optical path length occurring at the image plane is largely independent of the angles of incidence of the light rays on the optical components.

74. The optical corrector according to claim 73, wherein the optical corrector is configured for creating a substantially linear gradient of a phase shift, whereby a tilting of wavefronts running through the projection lens is at least partly compensated.

75. The optical corrector according to claim 74, comprising at least one wedge-shaped retarding element fabricated from a birefringent material.

76. The optical corrector according to claim 73, comprising a retarding element fabricated from a birefringent material and an optical element fabricated from an optically isotropic material, wherein the optically isotropic optical element is shaped complementary to the retarding element and is aligned with respect to the retarding element such that the retarding element and the optically isotropic optical element form a plane-parallel optical element.

77. The optical corrector according to claim 73, comprising at least one retarding element fabricated from a birefringent material having a gradient of the refractive index transverse to the optical axis of the optical corrector.

78. The optical corrector according to claim 74, comprising a retarding element fabricated from a birefringent material and an optical element fabricated from an optically isotropic material, wherein the optically isotropic optical element is shaped complementary to the retarding element and is aligned with respect to the retarding element such that the retarding element and the optically isotropic optical element form a plane-parallel optical element.

79. An optical corrector according to claim 74, comprising at least one retarding element fabricated from a birefringent material having a gradient of the refractive index transverse to the optical axis of the optical corrector.

80. A method for manufacturing semiconductor devices or other types of micro-devices comprising:
- arranging a mask having a prescribed pattern in the object plane of a projection lens;
- illuminating the mask using ultraviolet light; and
- using a projection lens to project an image of the pattern onto a photosensitive substrate situated in the vicinity of the image plane of the projection lens;
- wherein the projection lens comprises optical components illuminated by transmitted light rays at varying angles of incidence,
- wherein a difference in the length of a first optical path traversed by a first light ray having a first polarization direction and a second optical path traversed by a second light ray having a second polarization direction that differs from the first polarization direction occurs within at least one region of the image plane due to the optical configuration of the optical components, the optical configuration including at least one birefringent optical component transited by the first light ray and the second light ray, and contributing to the difference in the lengths of the first and second optical path through birefringence,
- wherein the projection lens further comprises at least one optical correction device that corrects differences in the optical path length of the light rays by altering at least one of the first optical path and the second optical path, and
- wherein the optical correction device is configured to render the difference in the optical path length occurring at the image plane substantially independent of the angles of incidence of the light rays on the optical components.

81. A method for manufacturing semiconductor devices or other types of micro-devices comprising:
- arranging a mask having a prescribed pattern in the object plane of a projection lens;
- illuminating the mask using ultraviolet light; and
- using a projection lens to project an image of the pattern onto a photosensitive substrate situated in the vicinity of the image plane of the projection lens;
- wherein the projection lens is a catadioptric projection lens having at least one mirror having a mirror surface at least partly inclined with respect to the optical axis and arranged between the object plane and image plane; and
- wherein the projection lens comprises optical components illuminated by transmitted light rays at varying angles of incidence, wherein a difference in the length of a first optical path traversed by a first light ray having a first polarization direction and a second optical path traversed by a second light ray having a second polarization direction that differs from the first polarization direction occurs within at least one region of the image plane due to the optical configuration of the optical components;
- wherein the projection lens further comprises at least one optical correction device that corrects differences in the optical path length of the light rays by altering at least one of the first optical path and the second optical path;
- wherein the optical correction device is configured to render the difference in the optical path length occurring at the image plane substantially independent of the angles of incidence of the light rays on the optical components; and
- wherein the optical correction means are configured for creating a substantially linear gradient of the phase shift, whereby a tilting of wavefronts running through the projection lens is at least partly compensated.

* * * * *